(12) United States Patent
Fisher et al.

(10) Patent No.: US 7,473,578 B2
(45) Date of Patent: Jan. 6, 2009

(54) ENCAPSULATION FOR PARTICLE ENTRAPMENT

(75) Inventors: Edward C. Fisher, Lucas, TX (US); Lawrence T. Latham, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 11/761,111

(22) Filed: Jun. 11, 2007

(65) Prior Publication Data

US 2007/0254403 A1 Nov. 1, 2007

Related U.S. Application Data

(62) Division of application No. 10/955,083, filed on Sep. 30, 2004, now Pat. No. 7,230,325, which is a division of application No. 09/705,466, filed on Nov. 3, 2000, now Pat. No. 6,841,412.

(60) Provisional application No. 60/163,862, filed on Nov. 5, 1999.

(51) Int. Cl.
*H01L 21/44* (2006.01)
(52) U.S. Cl. .................... 438/106; 438/48; 438/54; 438/55; 438/64
(58) Field of Classification Search .......... 438/106, 438/48, 54, 55, 64, 58, 115, 112, 689, 758
See application file for complete search history.

(56) References Cited

U.S. PATENT DOCUMENTS

| | | |
|---|---|---|
| 4,047,045 A | 9/1977 | Paxton, Jr. et al. |
| 4,382,327 A | 5/1983 | Bardens et al. |
| 5,622,873 A | 4/1997 | Kim et al. |
| 5,644,169 A | 7/1997 | Chun |
| 5,817,540 A | 10/1998 | Wark |
| 5,962,810 A | 10/1999 | Glenn |
| 6,028,690 A | 2/2000 | Carter et al. |
| 6,084,297 A | 7/2000 | Brooks et al. |
| 6,117,705 A | 9/2000 | Glenn et al. |
| 6,147,790 A | 11/2000 | Meier et al. |
| 6,169,328 B1 | 1/2001 | Mitchell et al. |
| 6,603,183 B1 | 8/2003 | Hoffman |
| 6,841,412 B1 | 1/2005 | Fisher et al. |
| 7,230,325 B2 | 6/2007 | Fisher et al. |
| 2003/0162325 A1* | 8/2003 | Tan et al. ............ 438/109 |

* cited by examiner

*Primary Examiner*—Walter L Lindsay, Jr.
(74) *Attorney, Agent, or Firm*—Charles A. Brill; Wade J. Brady, III; Frederick J. Telecky, Jr.

(57) ABSTRACT

A packaged micromechanical device (100) having a blocking material (116) encapsulating debris-generating regions thereof. The blocking material (116) prevents the generation of debris that could interfere with the operation of the micromechanical device (100). Debris-generating regions of the device (100), including debris-creating sidewalls and any debris-harboring cavities, as well as electrical connections (108) linking the device (100) to the package substrate (102) are encapsulated by the blocking material (116). The blocking material (116) avoids contact with any debris-intolerant regions (118) of the device (100). A package lid (122), which is glass in the case of many DMD packages, seals the device (100) in package cavity (120).

9 Claims, 3 Drawing Sheets

ENCAPSULATION FOR PARTICLE ENTRAPMENT

This application is a divisional of application Ser. No. 10/955,083, filed Sep. 30, 2004 now U.S. Pat. No. 7,230,325, which is a divisional of application Ser. No. 09/705,466, filed Nov. 3, 2000, now U.S. Pat. No. 6,841,412, which claims the benefit of provisional Application No. 60/163,862, filed Nov. 5, 1999.

CROSS-REFERENCE TO RELATED APPLICATIONS

The following patents and/or commonly assigned patent applications are hereby incorporated herein by reference:

| Patent No. | Filing Date | Issue Date | Title |
| --- | --- | --- | --- |
| 09/311,009 | May 13, 1999 | | Spring-Ring Micromechanical Device |

FIELD OF THE INVENTION

This invention relates to the manufacture of micromechanical devices, more particularly to packaging of micromechanical devices such as micromirror devices.

BACKGROUND OF THE INVENTION

Micromechanical devices are small structures typically fabricated on a semiconductor wafer using techniques such as optical lithography, doping, metal sputtering, oxide deposition, and plasma etching similar to those developed for the fabrication of integrated circuits.

Digital micromirror devices (DMDs), sometimes referred to as deformable micromirror devices, are a type of micromechanical device. Other types of micromechanical devices include accelerometers, pressure and flow sensors, gears and motors. While some micromechanical devices, such as pressure sensors, flow sensors, and DMDs have found commercial success, other types have not yet become commercially viable.

One problem common to most micromechanical devices is the problem of particulate contamination. While some micromechanical devices, such as pressure sensors, may not have exposed moving parts, most devices do have exposed components that move relative to each other. These moving parts can become mechanically blocked or electrically shorted by very small particles of debris. Although steps are taken during manufacture of the devices to clean debris from the devices, the fragile nature of some micromechanical devices and other factors conspire to prevent total elimination of the debris. Thus, debris inside micromechanical packages continues to be a significant cause of mechanical and electrical failures. What is needed is a way to prevent these failures caused by debris inside the micromechanical device package.

SUMMARY OF THE INVENTION

Objects and advantages will be obvious, and will in part appear hereinafter and will be accomplished by the present invention which provides a method and system for encapsulating debris-generating regions of the micromechanical devices. One embodiment of the claimed invention provides a method of protecting debris-intolerant micromechanical devices. The method comprises attaching a device to a substrate, encapsulating at leas tone debris-generating region with a blocking material, while avoiding contact between the blocking material and any debris-intolerant regions.

According to another embodiment of the claimed invention, a packaged micromechanical device is provided. The packaged micromechanical device comprises a package substrate, a micromechanical device supported by the package substrate and having at least one debris-generating region, blocking material attached to the device and covering at least one debris-generating region, and a package lid supported by the package substrate and enclosing the micromechanical device and the blocking material.

Advantages of the claimed method and system include the permanent blocking of debris generated by the debris-generating portions of the device. The debris-generating portions of the device include debris-creating regions such as the device sidewalls, and debris-harboring regions such as cavities under the device and other portions of the device, including the sidewall, that can trap debris and later release it. The blocking material not only provides permanent entrapment of debris, but entrapment of the debris is often cheaper than methods of eliminating the existing debris, such as cleansing or scrubbing the devices. While scrubbing the device can remove loose particles that have not yet broken off the device, scrubbing cannot prevent the device from creating particles in the future. An additional benefit of the blocking material is due to the reduction in package cavity volume. Since the blocking material displaces the gasses normally captured in the cavity, the environmental effects on the packaged device are reduced since there is less gas to react with the device.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

A new system and method has been developed to eliminate many of the debris-caused failures of micromechanical devices. These failures are eliminated by encapsulating the debris such that it cannot migrate to debris sensitive portions of the micromechanical device. The debris is encapsulated in place over portions of the device that are tolerant of the encapsulating material. The encapsulating material avoids regions of the micromechanical device, such as exposed moving components, that would be harmed by contact with the encapsulating material. In addition to encapsulating existing debris, the encapsulating material is also deposited over regions of the device that have been determined to generate significant quantities of debris. These regions typically include the sidewalls of the silicon substrates on which many micromechanical devices are formed.

Figure 1:
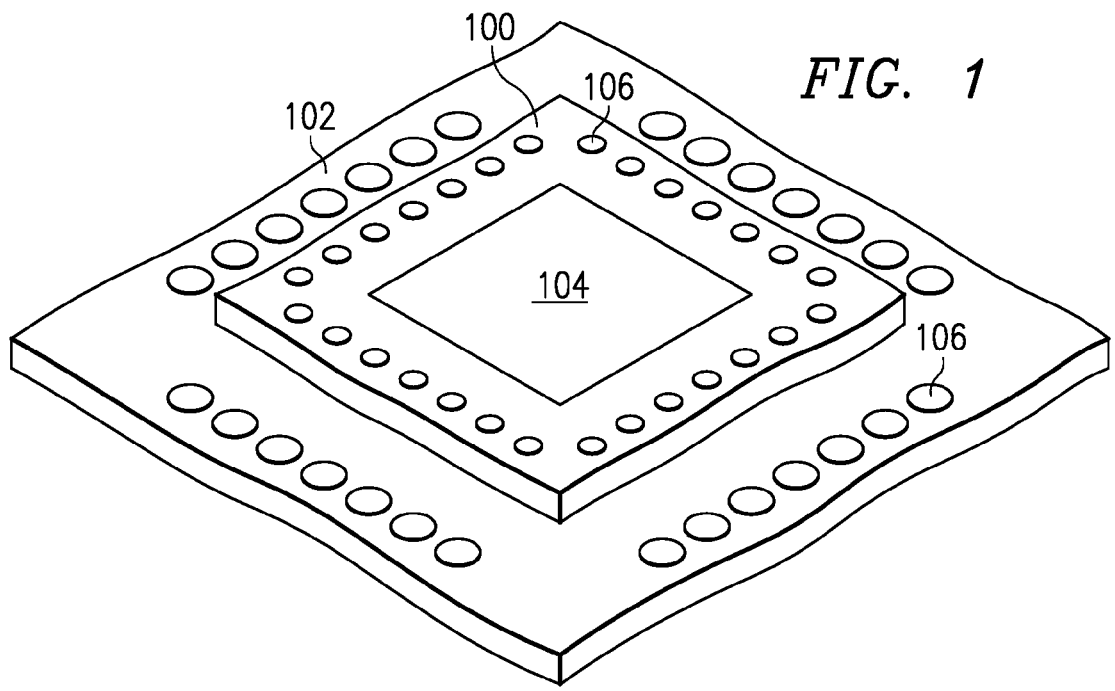
FIG. 1 is a perspective view of a micromechanical device, such as a digital micromirror device (DMD™), mounted to a package substrate.

FIG. 1 is a perspective view of a micromechanical device 100 such as a digital micromirror device (DMD™) mounted to a package substrate 102. FIG. 1, like the rest of the figures shown, is not drawn to scale but is drawing to illustrate particular features relevant to the invention disclosed herein. The device 100 in FIG. 1 is a portion of a silicon wafer on which a micromechanical device has been formed. The device has a debris intolerant area, which in the case of a DMD includes the array of mirrors. The perimeter of the device, and a region of the package surrounding the device, includes many bond pads 106 that allow electrical connection between the device and the package.

Figure 2:
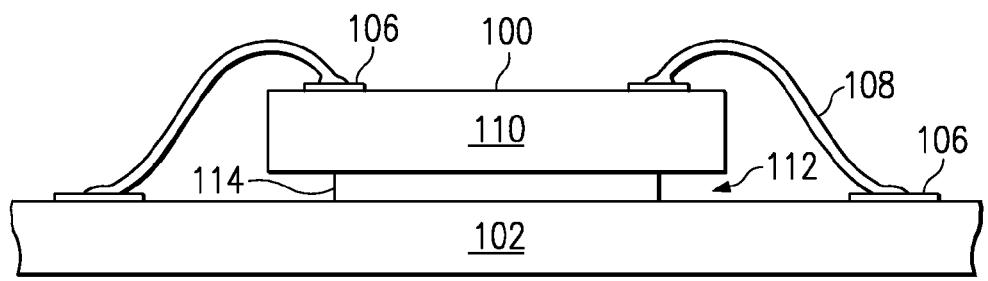
FIG. 2 is a cross-section side view of the device and package substrate of FIG. 1 showing bond wires connecting the bond pads on the device to those on the package substrate.

FIG. 2 is a cross-section side view of the device 100 and package substrate 102 of FIG. 1 showing bond wires 108 connecting the bond pads 106 on the device to those on the package substrate 102. Two regions of the device shown in FIG. 2 tend to be debris-generators. First, the side of the device, or sidewall 110, tends to create debris throughout the life of the device. The sidewall 110 is the portion of the device that is fractured when the device is separated from a silicon wafer. The separation process, whether performed by breaking the wafer or sawing the wafer, creates many fissures in the silicon crystal wafer. As the device undergoes thermal cycles and vibration, these fissures can grow and release silicon debris. Thus, even if all of the debris is washed from the device after wafer separation, the device itself can generate additional debris even after the device is hermetically sealed in a package.

The second class of debris-generating regions trap, and later release, debris. For example, debris can be trapped under the device in a gap 112 formed by voids in the adhesive 114 used to attach the device 100 to the package substrate 102, or in other regions that are difficult to rinse debris out of.

According to one aspect of the present invention, a blocking material is deposited on either the debris generating, or debris harboring regions, or both, to prevent debris from being released or generated by the device and migrating to the debris-intolerant portions of the device. Typically, the blocking material is an adhesive that is deposited around the perimeter of the device after the device is attached to the package substrate.

Figure 3:
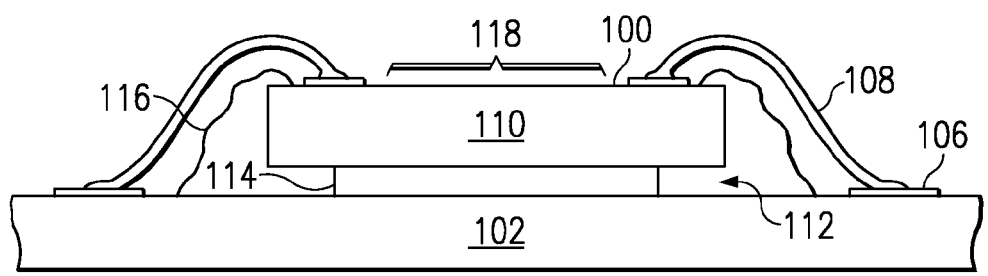
FIG. 3 is a cross-section side view of the device of FIG. 2 showing a quantity of blocking material deposited around and under the device.

FIG. 3 is a cross-section side view of the device of FIG. 2 showing a quantity of blocking material 116 that has been deposited around and under the device 100. As shown in FIG. 3, the blocking material 116 surrounds the device 100, encapsulating the debris-creating sidewall regions and either filling the debris-harboring regions or blocking debris from exiting the debris-harboring regions 112. The blocking material of FIG. 3 avoids the debris-sensitive regions 118 of the device 100. In FIG. 3, the device 100 is a digital micromirror device and the debris-sensitive region is the array of micromirrors on the surface of the device 100.

Figure 4:
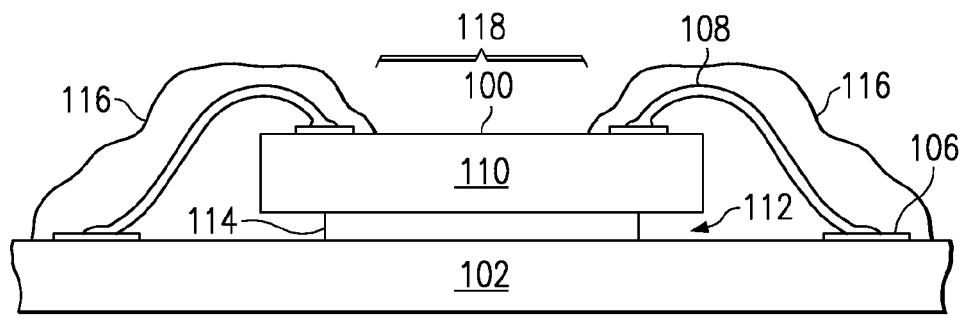
FIG. 4 is a cross-section view of the device of FIG. 3 showing the blocking material covering not only the sidewalls and debris-harboring regions of the device, but the bond wires as well.

FIG. 4 is a cross-section view of the device 100 of FIG. 3 showing the blocking material 116 covering not only the sidewalls and debris-harboring regions of the device 100, but the bond wires as well. Encapsulating the bond wires is sometimes necessary in order to cover the sidewalls 110 of a device 100 after the device 100 has been bonded to the package substrate 102 and electrically connected using bond wires 108. Encapsulating the bond wires 108 into only is necessary, it may improve operation of the device in a high-vibration environment.

The ideal blocking material should be easy to apply to the device 100 with sufficient control to ensure coverage of the debris-creating and harboring regions without allowing the blocking material 116 to reach the debris-sensitive regions. Additionally, the blocking material 116 should adhere to the device and other surfaces sufficiently to prevent the material from coming free of the device surface. One family of compounds that is ideally suited for use as a blocking material is the family of photo-curable adhesives. Two particularly well-suited adhesives are NOA88 and NEA123, both UV-curable optically-clear adhesives produced by Norland Corporation. While NOA88 and NEA123 harden when they are cured, compounds that remain sticky could provide a gettering function inside the package as well as a blocking function.

When used with digital micromirror devices, which must be undercut to remove the photoresist on which he micromirrors are formed, the devices 100 are typically undercut prior to bonding the device 100 to a package substrate 102. If the process flow uses the recently-developed method of attaching the device 100 to the package substrate 102 prior to undercutting the micromirrors, the blocking material may be applied prior to, or after, the mirrors are undercut. Preferably, the blocking material is applied prior to undercutting the micromirrors. In this manner, the debris is prevented before the micromirrors become sensitive to the debris. If the blocking material is applied before the undercutting process—a plasma etch process—the blocking material must be able to withstand the undercutting process without significant degradation.

Figure 5:
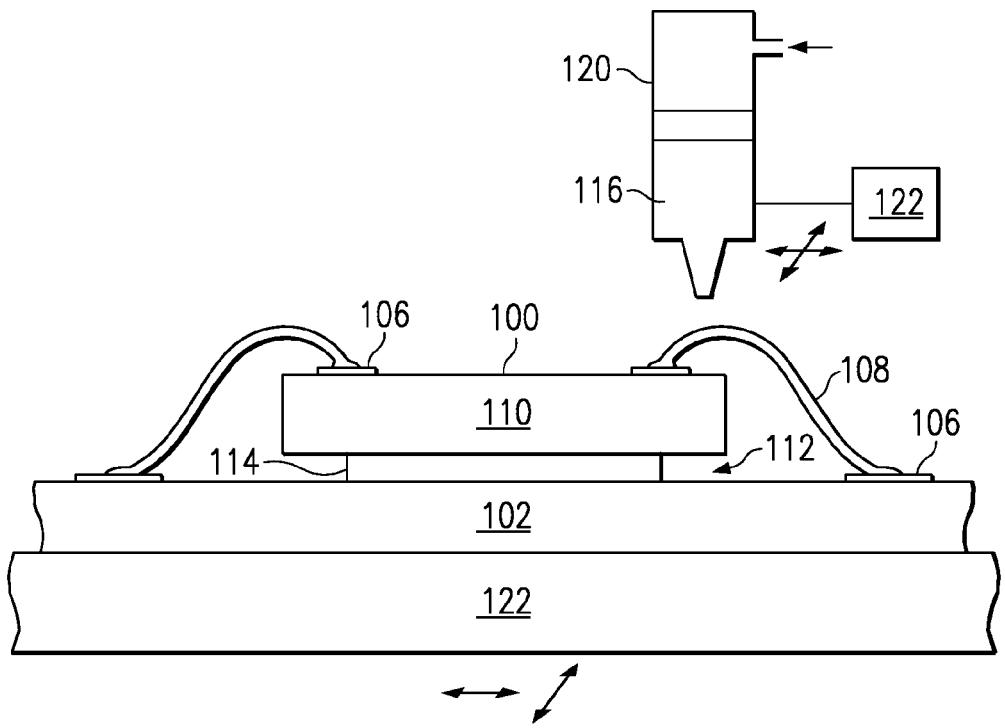
FIG. 5 is a schematic side view showing a typical application method using a syringe and two moveable X-Y stages.

The blocking material is applied in a variety of ways. The typical application method uses a syringe 120, shown in FIG. 5, to expel blocking material while the syringe 120 and device 100 are moved relative to each other, typically by use of an X-Y stage 122. The syringe 120 can be either a positive displacement or a pneumatic syringe. The amount of blocking material deposited is controlled by the rate of movement of the syringe 120 plunger and the rate of relative emotion generated by the X-Y stage. Examples of suitable syringes 120 include positive displacement syringes, in which a motor controls movement of the plunger, and pneumatic syringes, in which the plunger is controlled by air pressure. Many other application methods, such as spraying or dipping, can be used without departing from the teachings of this disclosure.

Figure 6:
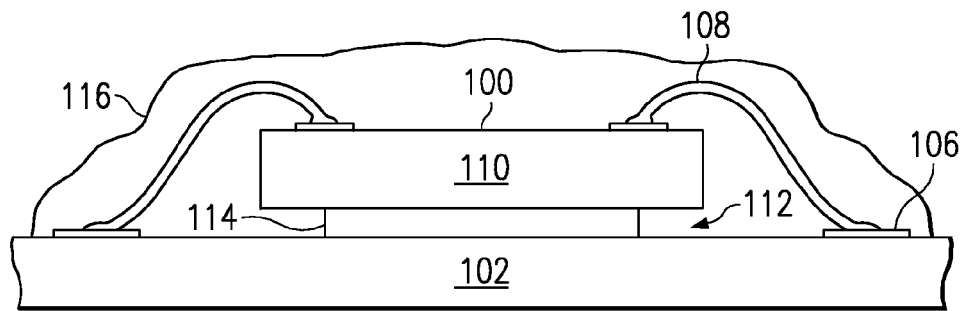
FIG. 6 is a cross-section side view of a device completely enclosed by blocking material.
Figure 7:
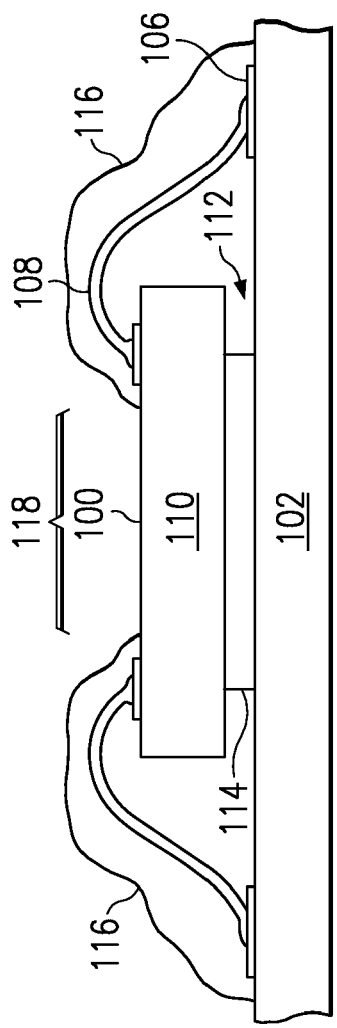
FIG. 7 is a cross-section side view of the device of FIG. 6 having a portion of the blocking material removed to expose debris-sensitive regions of the device.

A second method of applying the blocking material is shown in FIGS. 6 and 7. In FIG. 6, the blocking material completely encloses or pots the device. A portion of the blocking material 116 is then removed, as shown in FIG. 7, to expose the debris-sensitive regions 118 of the device 100. Selective removal of the blocking material 116 is accomplished by photo-lithographic processes using masks, by selectively curing part of the blocking material and removing the uncured material, or through the use of other means. While the encapsulate and remove process requires additional steps and is therefore expected to be more cumbersome and expensive, it can provide very precise location of the blocking material if necessary. For example, the blocking material can be removed to form an aperture over an optically active region of the device.

Figure 8:
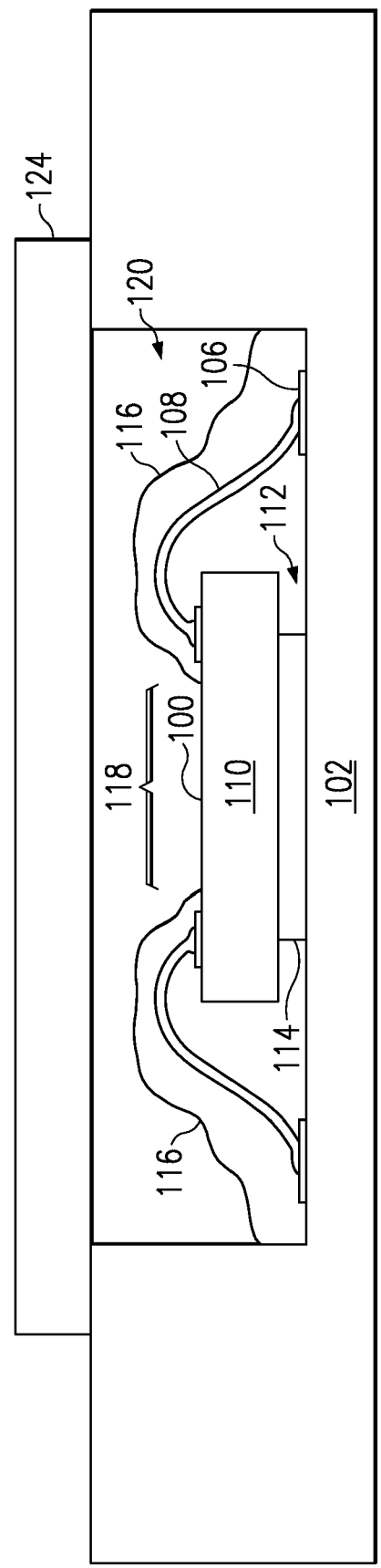
FIG. 8 is a cross-section side view of the device of FIG. 4 sealed in a package cavity.

FIG. 8 is a cross-section side view of a packaged micromechanical device 100 showing use of blocking material 116 to prevent the generation of debris that could interfere with the operation of the micromechanical device 199. In FIG. 8, the debris-generating regions of the device 100, including the debris-creating sidewalls and any debris-harboring cavities, as well as the electrical connections 108 linking the device 100 to the package substrate 102 are encapsulated by the blocking material 116. The blocking material 116 avoids contact with any debris-intolerant regions 118 of the device 100. A package lid 122, which is glass in the case of many DMD packages, seals the device 100 in a package cavity 120.

the blocking material 116 not only provides permanent entrapment of debris, including debris generated after the device is packaged, but entrapment of the debris is often cheaper than methods of eliminating the existing debris, such as scrubbing the devices. While scrubbing the device will remove loose particles that have not yet broken off the device, scrubbing cannot prevent the device from generating particles in the future. An additional benefit of the blocking material 116 is the reduction in package cavity volume when the blocking material 116 is used. Since the cavity volume is reduced, the environmental effects on the packaged device are also reduced since there are fewer captured gasses to react with the device.

Thus, although there has been disclosed to this point a particular embodiment of sidewall encapsulation and method therefore, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. A method of protecting debris-intolerant micromechanical devices, said method comprising:
   providing a device having at least one debris-generating region, and at least one debris-intolerant region;
   encapsulating at least one of said debris-generating regions and at least a portion of at least one of said debris-intolerant regions with a blocking material;
   removing said blocking material from said at least one of said debris-intolerant regions; and
   attaching a package lid to said package substrate, to enclose said device and said blocking material.

2. The method of claim 1, said attaching a device step further comprising:
   attaching a device to a substrate, said device having at least one said debris-generating region comprising a sidewall.

3. The method of claim 1, said encapsulating step further comprising:
   encapsulating at least one of said debris-generating regions using an adhesive blocking material.

4. The method of claim 1, said encapsulating step further comprising:
   encapsulating at least one of said debris-generating regions using a photo-curable adhesive blocking material.

5. The method of claim 1, said encapsulating step further comprising:
   encapsulating at least one of said debris-generating regions using an adhesive blocking material that remains tacky to perform a gettering function.

6. The method of claim 1, further comprising the step of:
   electrically connecting at least one bond pad on said substrate with at least one bond pad on said device using an electrical connection.

7. The method of claim 6, said encapsulating step comprising:
   encapsulating at least one of said debris-generating regions and said electrical connection.

8. The method of claim 6, said encapsulating step comprising:
   electrically connecting at least one bond pad on said substrate with at least one bond pad on said device using a bond wire.

9. The method of claim 6, said encapsulating step comprising:
   encapsulating at least one of said debris-generating regions and said bond wires.

* * * * *